(12) United States Patent
Matsuno et al.

(10) Patent No.: US 8,685,848 B2
(45) Date of Patent: Apr. 1, 2014

(54) MANUFACTURING METHOD OF SILICON CARBIDE SEMICONDUCTOR DEVICE

(75) Inventors: Yoshinori Matsuno, Tokyo (JP); Yoichiro Tarui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/355,710

(22) Filed: Jan. 23, 2012

(65) Prior Publication Data

US 2012/0302051 A1 Nov. 29, 2012

(30) Foreign Application Priority Data

May 27, 2011 (JP) ................. 2011-118661

(51) Int. Cl.
*H01L 21/329* (2006.01)

(52) U.S. Cl.
USPC .............. 438/571; 257/E21.06; 257/E21.064; 257/E21.359; 257/E21.603; 257/E21.698; 438/285; 438/483; 438/572; 438/582; 438/603; 438/698; 438/931

(58) Field of Classification Search
USPC ............... 257/E21.06, E21.064, E21.359, 257/E21.603, E21.698; 438/285, 483, 571, 438/572, 582, 603, 698, 931
See application file for complete search history.

(56) References Cited

U.S. PATENT DOCUMENTS

| | | | |
|---|---|---|---|
| 2009/0098719 A1 | 4/2009 | Matsuno et al. | |
| 2011/0215338 A1* | 9/2011 | Zhang | 257/73 |
| 2012/0028453 A1 | 2/2012 | Matsuno et al. | |

FOREIGN PATENT DOCUMENTS

| | | |
|---|---|---|
| JP | 2001-35838 | 2/2001 |
| JP | 2003-60193 | 2/2003 |
| JP | 2004-363326 | 12/2004 |
| JP | 2006-120761 | 5/2006 |
| JP | 2006-202883 | 8/2006 |
| JP | 2007-141950 | 6/2007 |
| JP | 2008-53418 | 3/2008 |
| JP | 2008-251772 | 10/2008 |
| JP | 2009-94392 | 4/2009 |
| JP | 2009-224661 | 10/2009 |
| JP | 2010-68008 A | 3/2010 |
| JP | 2010-262952 | 11/2010 |
| WO | WO 2010/119491 A1 | 10/2010 |

OTHER PUBLICATIONS

Office Action issued Apr. 29, 2013, in Korean Patent Application No. 10-2012-0047891 with partial English translation.
Office Action issued in Japanese Patent Application No. 2011-118661 on Jun. 11, 2013.
Office Action issued in Japanese Patent Application No. 2011-118661 on Sep. 24, 2013 with partial English translation.

* cited by examiner

*Primary Examiner* — Asok K Sarkar
(74) *Attorney, Agent, or Firm* — Oblon, Spivak, McClelland, Maier & Neustadt, L.L.P.

(57) ABSTRACT

A silicon oxide film is formed on an epitaxial layer by dry thermal oxidation, an ohmic electrode is formed on a back surface of a SiC substrate, an ohmic junction is formed between the ohmic electrode and the back surface of the SiC substrate by annealing the SiC substrate, the silicon oxide film is removed, and a Schottky electrode is formed on the epitaxial layer. Then, a sintering treatment is performed to form a Schottky junction between the Schottky electrode and the epitaxial layer.

8 Claims, 10 Drawing Sheets

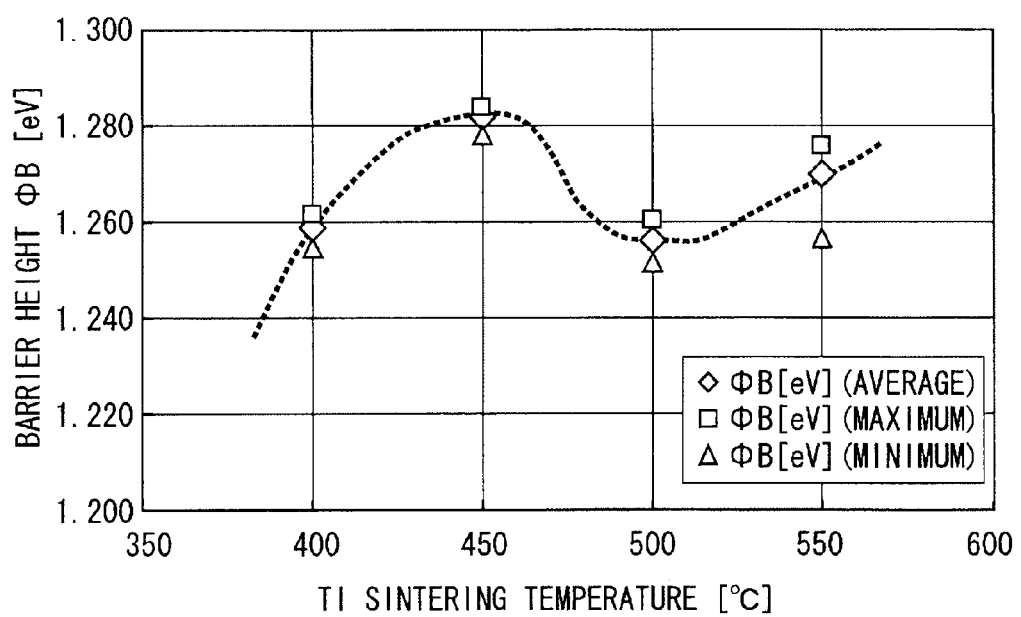
F I G . 1 3

MANUFACTURING METHOD OF SILICON CARBIDE SEMICONDUCTOR DEVICE

BACKGROUND OF THE INVENTION

1. Field of the Invention

The present invention relates to a manufacturing method of a silicon carbide semiconductor device and more particularly, to a manufacturing method of a silicon carbide Schottky barrier diode.

2. Description of the Background Art

It is important to select a Schottky metal and to stabilize forward characteristics in producing a silicon carbide Schottky barrier diode (hereinafter, referred to as SiC—SBD). In general, the Schottky metal includes Ti (titanium), Ni (nickel), Mo (molybdenum), and W (tungsten), but in a case where a Ti Schottky barrier diode is produced, when Ni is employed as an electrode on a back surface to form a Ni ohmic junction, there are following process characteristics and problem.

In other words, a SiC—SBD having a high withstand voltage at kV level has a configuration in which a Schottky electrode is formed on an n-type epitaxial layer formed on a silicon carbide substrate, but in this structure, an electric field is likely to concentrate at an edge part of a junction surface between the epitaxial layer and the Schottky electrode, so that a p-type termination structure is generally formed in an upper layer part of the epitaxial layer which corresponds to the edge part of the junction surface (Schottky junction surface) to alleviate the electric field concentration. The p-type termination structure is a p-type impurity region formed around an electrode region of the SBD, and it is formed in such a manner that ions of a p-type impurity such as Al (aluminum) or B (boron) are implanted into an n-type epitaxial layer, and subjected to an activation annealing treatment by a high-temperature heat treatment at 1500° C. or higher.

In order to obtain the Schottky junction having preferable characteristics, it is necessary to remove an altered layer on a SiC surface generated during the high-temperature heat treatment, and as a technique to remove this altered layer, well-known techniques are disclosed in Japanese Patent Application Laid-Open Nos. 2008-53418, 2001-35838, 2004-363326, and 2007-141950.

As a method to remove the altered layer, Japanese Patent Application Laid-Open No. 2008-53418 discloses a method in which a SiC surface layer is sacrificially oxidized after an activation annealing treatment, a sacrificial oxide film having a thickness of 40 nm to less than 140 nm is formed in a surface layer, and the altered layer is removed together with the sacrificial oxide film.

Japanese Patent Application Laid-Open No. 2001-35838 discloses a method in which a natural oxide film is removed by a hydrofluoric acid treatment, and a SiC surface is cleaned by plasma etching with plasma of mixture gas of hydrogen and oxygen or plasma of gas containing fluorine atoms.

Japanese Patent Application Laid-Open No. 2004-363326 discloses that an altered layer having a thickness of about 100 nm is generated, and a method to remove the altered layer having the thickness of about 100 nm by etching in an atmosphere containing hydrogen, or a mechanical polishing.

Japanese Patent Application Laid-Open No. 2007-141950 discloses a method in which a thermal oxide film is formed on both front and back surfaces of a substrate in an oxygen atmosphere at 1160° C. after an activation annealing treatment, and just after that, the thermal oxide film is removed with a BHF solution.

In addition, regarding the production of the SiC—SBD, in order to stabilize the forward characteristics of the diode, especially a barrier height $\phi B$ or n value (ideal coefficient), conventionally well-known effective methods include a method in which a silicon carbide substrate is covered with a process protective film until just before a Schottky metal is formed, the process protective film is removed, and a Schottky metal (Ti in this case) is formed, and a method in which after the Schottky metal has been formed, it is subjected to a Ti sintering treatment at 400 to 600° C.

When the sintering treatment is not performed on the Ti Schottky barrier diode, the barrier height $\phi B$ is largely varied in a range of 1.05 to 1.25 eV. In this case, characteristics of the individual SiC—SBD are largely varied, which may raise the problem that the characteristics cannot be aligned when a switching element or a power module or the like is constituted together with a silicon IGBT or a SiC—MOS FET, and the problem that a rate of non-defective products is lowered when a non-defective product selection standard is tightened. Therefore, it is important to produce a semiconductor device having aligned characteristics in realizing a mass production process and commercialization.

However, even when the sacrificial oxide film is formed in the previous step as the process protective film, or the sintering treatment is performed at 400 to 600° C. after Ti has been formed as the Schottky metal, stability of the forward characteristics, especially the barrier height $\phi B$ of the diode cannot get a satisfactory result for a specification required for a practical use, and the variation in reverse leak current is problematically large.

SUMMARY OF THE INVENTION

It is an object of the present invention to provide a semiconductor device capable of stabilizing forward characteristics, especially a barrier height $\phi B$ of a diode and reducing a variation in leak current in producing a silicon carbide Schottky diode.

A preferred embodiment of a manufacturing method of a silicon carbide semiconductor device includes (a) a step of preparing a first conductivity type silicon carbide substrate, (b) a step of forming a first conductivity type epitaxial layer on one main surface of the silicon carbide substrate, (c) a step of forming a termination structure by implanting ions of a second conductivity type impurity in an upper layer part of the epitaxial layer around a part for an electrode region, (d) a step of forming a silicon oxide film on the epitaxial layer by dry thermal oxidation, (e) a step of forming a first metal film on another main surface of the silicon carbide substrate, (f) a step of forming an ohmic junction between the first metal film and the other main surface of the silicon carbide substrate by performing a heat treatment on the silicon carbide substrate at a first temperature, after the step (e), (g) a step of removing the silicon oxide film, after the step (f), (h) a step of forming a second metal film on the epitaxial layer, after the step (g), and (i) a step of forming a Schottky junction between the second metal film and the epitaxial layer by performing a heat treatment on the silicon carbide substrate at a second temperature, after the step (h).

According to the preferred embodiment of the manufacturing method of the silicon carbide semiconductor device, the silicon carbide semiconductor device can stabilize the forward characteristics, especially the barrier height $\phi B$ of the diode, and reduce the variation in reverse leak current.

These and other objects, features, aspects and advantages of the present invention will become more apparent from the

BRIEF DESCRIPTION OF THE DRAWINGS

FIG. 13 is a view showing an optimal temperature of Ti sintering;

DESCRIPTION OF THE PREFERRED EMBODIMENTS

A step control epitaxy is used to correctly inherit a polytype of a substrate crystal, in epitaxially growing of SiC. The step control epitaxy uses an off-angle substrate having a step-shaped surface structure provided by tilting a substrate surface orientation at several degrees from a (0001) surface serving as a basic crystal surface (basal plane). In a case of a SiC substrate having a polytype of 4H, a substrate tilted by 8° or 4° in a <112_0> direction ("_" is a bar line marked above 2) is used in general.

According to a SiC—SBD produced by a manufacturing method of a silicon carbide semiconductor device according to the present invention in the following description, when the substrate having an off angle of 8° is used, a barrier height after completing a wafer process is $1.25 \leq \phi B \leq 1.29$, and when the substrate having an off angle of 4° is used, the barrier height is $1.21 \leq \phi B \leq 1.25$, so that a stable result is obtained in either case.

Hereinafter, a description will be made of preferred embodiments of the manufacturing method of the silicon carbide semiconductor device according to the present invention with the substrate having the off angle of 8° taken as one example.

<First Preferred Embodiment>

Figure 1:
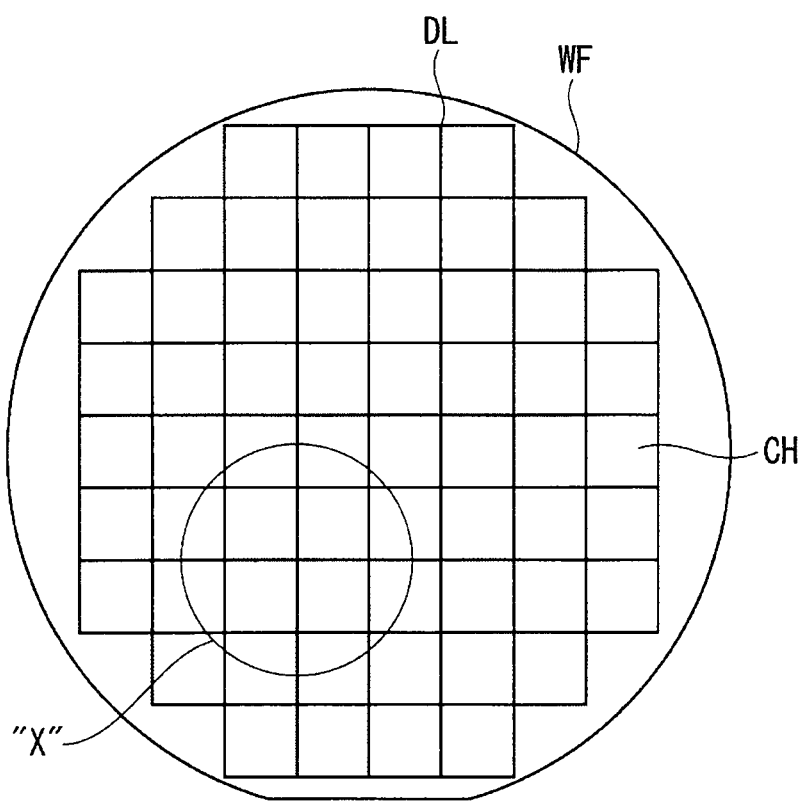
FIG. 1 is a plan view showing one example of a layout of semiconductor chips in a SiC wafer.

FIG. 1 is a plan view showing one example of a layout of semiconductor chips in a SiC wafer WF, in which a plurality of dicing lines DL are set vertically and horizontally in the SiC wafer WF. A rectangular region surrounded by the dicing lines DL is a chip region CH, and when the chip regions CH are diced, SiC—SBD chips are individually isolated.

Figure 2:
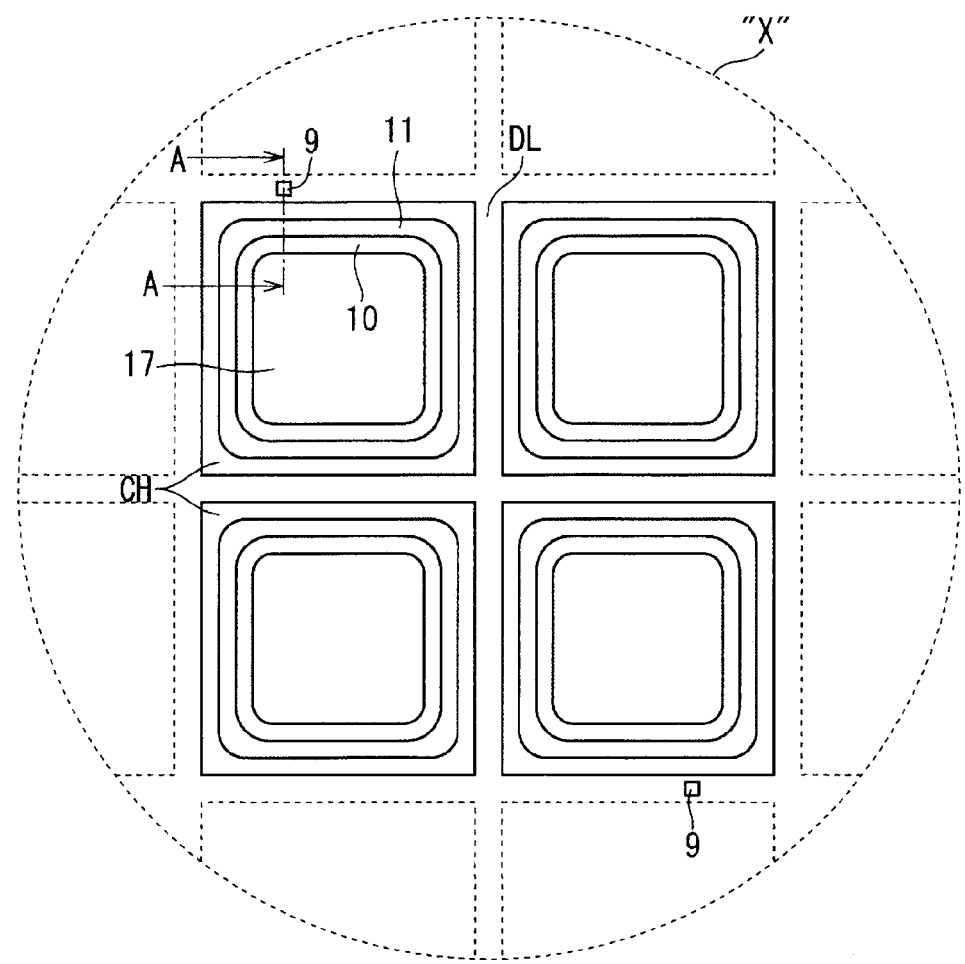
FIG. 2 is a partial plan view of the layout of the semiconductor chips.

FIG. 2 is a plan view showing a part surrounded by a region X shown in FIG. 1, and shows an upper surface structure of the SiC—SBD. In addition, FIG. 2 shows an electrode region 17 on which a Schottky electrode will be formed later, and a GR (Guard Ring) region 10 and a JTE (Junction Termination Extension) region 11 which surround the electrode region 17, and shows a state before the Schottky electrode is formed on the electrode region 17.

In addition, the four chip regions CH are shown in 2 rows and 2 columns in FIG. 2, which illustrates a case where the four chip regions are exposed at one shot in photolithography. Thus, a plurality of alignment marks 9 for alignment an exposure mask required in the photolithography are provided on the dicing lines DL to define the four chip regions.

The alignment marks 9 each have a rectangular shape in a planar view, and are provided on the dicing line DL on an upper side of the chip region CH on the uppermost left side in front of the drawing, and on the dicing line DL on a lower side of the chip region CH on the lowermost right side in front of the drawing, but the planar shape and the arrangement of the alignment marks 9 are just one example.

Figure 3:
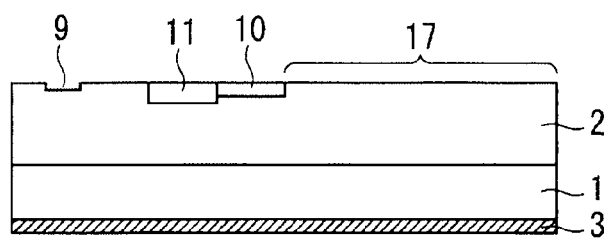
FIG. 3 is a cross-sectional view showing a cross-sectional configuration of a chip region.

FIG. 3 is a cross-sectional view showing a cross-sectional configuration of the chip region CH taken along line A-A in FIG. 2. As shown in FIG. 3, an n-type epitaxial layer 2 is formed on an n-type SiC substrate 1, the GR region 10 having a depth of about 0.6 μm and a width of about 20 μm, and the JTE region 11 having a depth of about 0.8 μm and a width of about 20 μm are formed in an upper layer part of the epitaxial layer 2 on the outside of the electrode region 17, and the alignment mark 9 is formed on the further outside of the JTE region 11.

The GR region 10 and the JTE region 11 are provided to alleviate concentration of an electric field at an end of the Schottky electrode, in order to stably ensure a withstand voltage over kV in the SiC—SBD. Although the concentration of the electric field can be alleviated only by the GR region 10, the JTE region 11 having an impurity concentration a little lower than that of the GR region 10 is continuously provided on the further outside in order to alleviate a surface electric field.

Next, a manufacturing method of a SiC—SBD according to a first preferred embodiment will be described with reference to FIGS. 4 to 12 which are cross-sectional views sequentially showing production steps.

Figure 4:
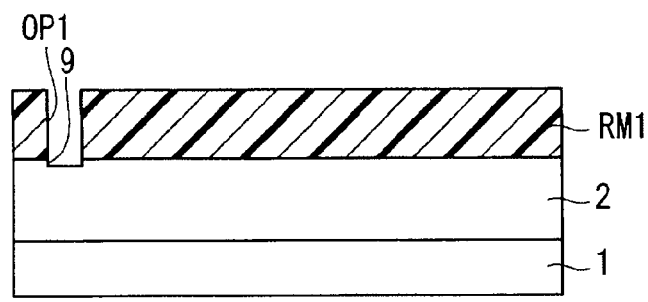
FIGS. 4 to 12 are cross-sectional views showing steps of producing a SiC—SBD of a first preferred embodiment according to the present invention.

First, in a step shown in FIG. 4, the n-type SiC substrate 1 having a (0001) silicon surface having a polytype of 4H and having an off angle of 8° is prepared. An n-type impurity concentration of the SiC substrate 1 is relatively high ($n^+$) and its resistivity is about 0.02 Ω·cm.

Then, the epitaxial layer 2 containing an n-type impurity having a concentration ($5 \times 10^{15}/\text{cm}^3$) which is relatively low compared to that of the SiC substrate 1 is epitaxially grown on the (0001) silicon surface (referred to as one main surface) of the SiC substrate 1. A thickness of the epitaxial layer 2 is determined based on the withstand voltage, and when the withstand voltage is within a range of 600 V to 1700 V, the thickness is about 5 to 15 μm.

Then, a resist mask RM1 is formed on the epitaxial layer 2, and an opening OP1 to form the alignment mark 9 is formed by photolithography. Then, the surface of the epitaxial layer 2 is etched by about 0.3 μm through the opening OP1, thereby the alignment mark 9 is formed. Thus, in the following photolithography, the exposure masks are laminated based on the alignment mark 9.

Figure 5:
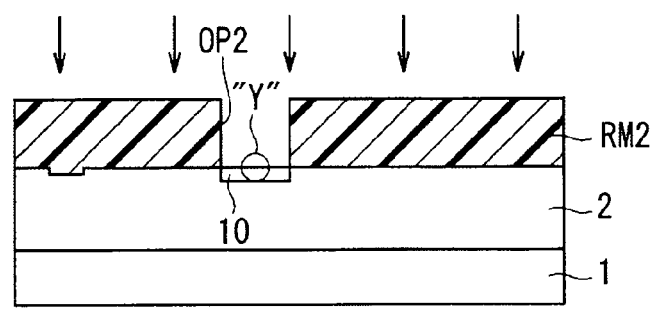

Then, after the resist mask RM1 has been removed, in a step shown in FIG. 5, a resist mask RM2 is formed on the epitaxial layer 2, and an opening OP2 to form the GR region 10 is patterned by photolithography. Thus, for example, ions of Al as a p-type impurity are implanted from an upper part of the resist mask RM2, and the GR region 10 is formed in the upper layer part of the epitaxial layer 2 through the opening OP2. An implantation condition at this time is such that a peak concentration becomes $5\times10^{17}/$ cm$^3$ at energy of 350 keV.

Figure 6:
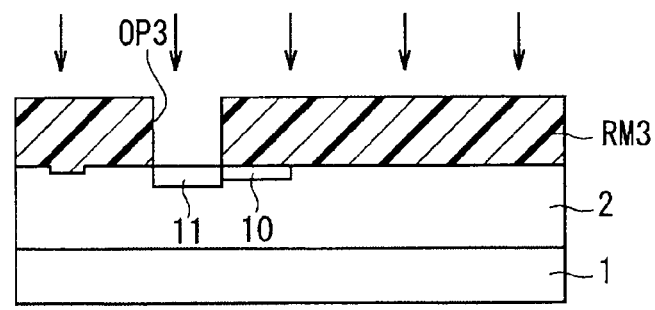

Then, after the resist mask RM2 has been removed, in a step shown in FIG. 6, a resist mask RM3 is formed on the epitaxial layer 2, and an opening OP3 to form the JTE region 11 is patterned by photolithography. Thus, ions of Al as a p-type impurity are implanted from an upper part of the resist mask RM3, and the JTE region 11 is formed in the upper layer part of the epitaxial layer 2 through the opening OP3. An implantation condition at this time is such that a peak concentration becomes $2\times10^{17}/$ cm$^3$ at energy of 500 keV.

To complete the GR region 10 and the JTE region 11 as a termination structure, it is necessary to activate the implanted impurity by annealing. Thus, after removing the resist mask RM3, annealing is performed in a RTA (Rapid Thermal Annealing) furnace in an Ar atmosphere under ordinary pressure. In this case, before the annealing treatment, a carbon protective film called a graphite cap (G-cap) is formed on a whole surface of the SiC wafer in general, in order to prevent a concavo-convex surface called step bunching from being generated. By annealing the SiC wafer having formed the graphite cap in a single-wafer-processing RTA furnace for 10 minutes within a temperature range of 1500 to 1700° C., the p-type impurity is activated at a rate of 50 to 90%, and can sufficiently function as the termination structure.

When the termination structure is completed, the electric field can be prevented from concentrating at an edge part of a junction surface between the epitaxial layer and the Schottky electrode.

In addition, by forming the graphite cap, the step bunching equal to or more than 1 nm is not generated. The fact that an activation rate is high indicates that a recrystallized state of a crystal which has been collapsed in the implantation step is in almost a perfect condition, and contributes to realizing high reliability as the semiconductor device.

In addition, in a case where annealing is performed without providing the graphite cap, step bunching equal to or more than 1 nm is generated, a thickness of a thermal oxide film to be formed later varies largely, and the oxide film is partially left even after the thermal oxide film has been removed, which may increase a leak current.

The graphite cap only has to have a film thickness of 20 nm or more and is formed by CVD (Chemical Vapor Deposition) with a liquid material such as $C_2H_5OH$. For example, a film thickness of 40 to 50 nm can be formed at 900° C. for 60 minutes. It may be removed by dry ashing after the activation annealing.

In addition, a method to prevent the step bunching without forming the graphite cap includes a method in which with a furnace type SiC—CVD device, annealing is performed at 1350° C. for 15 minutes in an atmosphere of decompressed $H_2$ and $C_3H_8$. This annealing condition has been obtained to keep the step bunching below 1 nm by adjusting pressure in the atmosphere, temperature, and time while comparing to the annealing treatment in the Ar atmosphere, and thus, by employing the above annealing condition, the concavo-convex surface represented by the step bunching after the annealing treatment can be below 1 nm.

After the above activation annealing, an altered layer (damaged layer) ranging from an uppermost surface of the epitaxial layer 2 to a depth of 100 to 150 nm is removed by dry etching.

Since the altered layer of the surface of the epitaxial layer 2 cannot be removed by the thermal oxide film to be formed in the next step, it is previously removed by the dry etching, so that the Schottky electrode can be formed on the preferable surface of the epitaxial layer 2 after the thermal oxide film has been removed.

Figure 7:
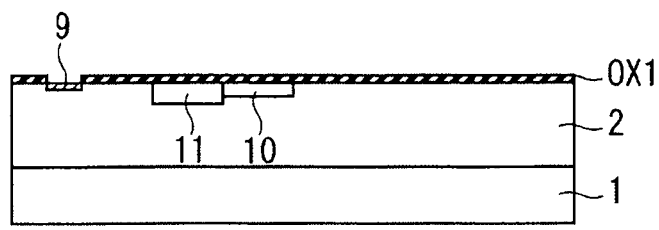

After the altered layer has been removed, an ohmic electrode is formed on a (000$\overline{1}$) carbon surface ("_" is a bar line marked above 1) of the SiC wafer, that is, another main surface (back surface) of the SiC substrate 1 opposite to the one main surface, on which the epitaxial layer 2 has been formed, but prior to that, in a step shown in FIG. 7, a silicon oxide film OX1 is formed on the epitaxial layer 2 to be 15 to 40 nm thick.

After the ohmic electrode has been formed on the back surface of the SiC wafer, an annealing treatment is performed at about 1000° C. At this time, the silicon oxide film OX1 serves as a process protective film to protect the surface of the epitaxial layer 2 from being polluted by Ni as a material of the ohmic electrode and a metal impurity staying in the annealing device and it is formed by dry thermal oxidation performed in a dried oxygen atmosphere.

Hereinafter, a description will be made regarding the reason why the silicon oxide film OX1 is formed by the dry thermal oxidation. For example, in a case where a SiC—SBD having a withstand voltage of 1200 V is produced, when the thermal oxide films are formed by dry oxidation and wet oxidation after the implanted impurity has been subjected to the activation annealing, the completed SBDs have a significant difference in reverse leak current characteristics.

More specifically, as for the SBD provided such that the silicon oxide film formed by the dry oxidation is removed by wet etching with a hydrofluoric acid and the Schottky electrode (Ti) is formed, and as for the SBD provided such that the silicon oxide film formed by the wet oxidation is removed by wet etching with a hydrofluoric acid and the Schottky electrode (Ti) is formed, their typical values of the reverse leak current when 1200 V is applied are 10 to 100 μA/cm$^2$ and 1 to 10 mA/cm$^2$, respectively, and they differ by 1 to 3 digits.

The reason why the considerable significant difference is generated will be described using a following model. That is, as for the dry oxidation, it is considered that isotropic oxidation slowly progresses, and surplus carbon tends to diffuse in a thermally-equilibrated manner.

Meanwhile, as for the wet oxidation, since a chemical action is strong, oxidation speed depends on an orientation, and preferential oxidation and proliferation oxidation progress in a crystal defect, so that surplus carbon could be locally precipitated. Due to this difference, as for surface flatness after the oxide film has been removed, concavity and convexity is likely to be locally generated in the case where the oxide film formed by the wet oxidation is removed, and it is considered that this causes the increase in reverse leak current. In addition, a general model explanation about the thermal oxidation of SiC is described on pages 82 and 83 in "Base and Application of SiC element" (by Kazuo Arai and Sadashi Yoshida, Ohmsha, Ltd.).

In addition, the reason why the thickness of the silicon oxide film OX1 is set to 15 to 40 nm will be described below. That is, in order to obtain an effect as the process protective film, at least a thickness of 15 nm or more which corresponds to a few atomic layers is needed, otherwise the film does not function as the protective film physically (mechanically) and chemically. In addition, as for the uppermost limit, since it needs a long time to form the film in the dry thermal oxidation compared to the wet thermal oxidation, the thickness up to about 40 nm is a realistic thickness in view of the film forming time.

In addition, based on the models subjected to the wet oxidation and dry oxidation described above, even in the case of the dry oxidation, when the silicon oxide film OX1 is thickly formed, the surplus carbon could be locally precipitated, so that the thickness is to be less than 40 nm, more preferably, to be about 20 nm.

Here, a junction part that has most effect on the device characteristics in the SiC—SBD is the junction interface serving as the Schottky junction between the Schottky electrode (such as Ti) and the SiC, so that it is preferable to form the Schottky electrode first, and then form the ohmic electrode, but since the annealing treatment (ohmic annealing treatment) needs to be performed at about 1000° C. in order to obtain the preferable ohmic junction between Ni and SiC, the ohmic electrode is formed first in this case because the Schottky junction between Ti and SiC is damaged in this high-temperature treatment.

As described above, by protecting the electrode region with the silicon oxide film OX1 formed by the dry thermal oxidation before the ohmic electrode is formed of Ni, a variation in characteristics caused by a Ti sintering treatment which will be described later can be reduced.

In addition, the silicon oxide film OX1 is also formed on the back surface of the SiC wafer, and the silicon oxide film OX1 formed on the back surface is removed by polishing the back surface before the ohmic electrode is formed. FIG. 7 shows a state in which the silicon oxide film OX1 has been removed from the back surface.

Figure 8:
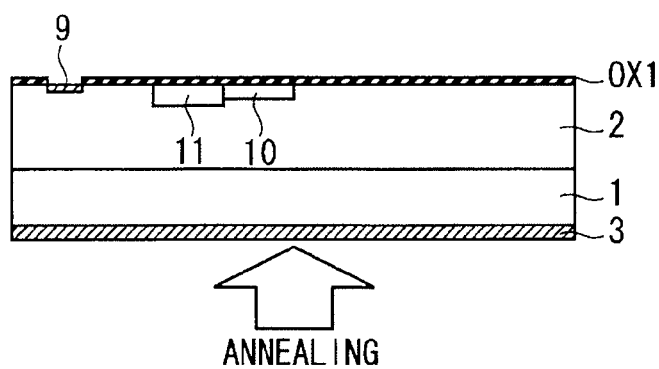

Then, in a step shown in FIG. 8, a Ni film having a thickness of about 100 nm is formed on the back surface of the SiC wafer, that is, on the back surface of the SiC substrate 1 by sputtering, and an ohmic electrode 3 is provided with the ohmic junction formed with the SiC substrate.

Then, the annealing treatment is performed at about 1000° C. as described above, and an annealing condition is set such that the surplus carbon is not segregated on the interface between SiC and Ni, and a good quality Ni silicide is formed.

Figure 9:
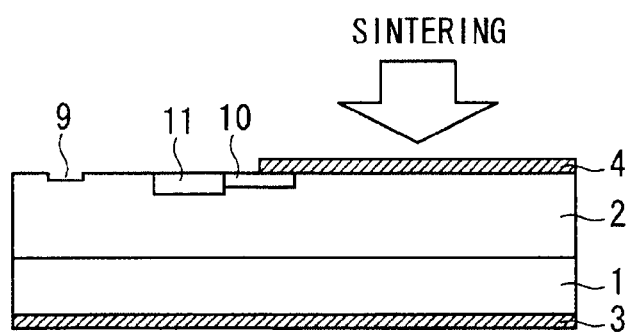

Then, in a step shown in FIG. 9, the silicon oxide film OX1 on the epitaxial layer 2 is removed by wet etching using a hydrofluoric acid, and then a Ti film having a thickness of about 200 nm is formed by sputtering. Then, a resist mask is formed by photolithography on a part to form a Schottky electrode 4, and the Ti film is patterned by wet etching with the resist mask, thereby the Schottky electrode 4 is provided. This patterning is performed to form the Schottky electrode 4 on the epitaxial layer 2 surrounded by the GR region 10, and on a part of the GR region 10.

Then, a sintering treatment is performed at 450±50° C., more preferably at 450±20° C. for 15 minutes. When the Schottky junction between Ti and n-type SiC is sintered, a barrier height (ΦB is increased to about 1.25 eV, and a variation in barrier height (ΦB can be reduced. For example, when Ti is sintered at 450° C., a barrier height φb is stabilized at 1.250 to 1.290 eV. As a result, forward characteristics of the diode becomes stable and a variation in reverse leak current can be reduced.

In addition, in an actual process, a polyimide resin is formed to protect the surface of the epitaxial layer 2 to which the GR region 10 and the JTE region 11 are exposed, and a thermal treatment is performed at 350° C. to cure it, so that a thermal history is generated even in a case where the Ti sintering is not performed.

It has been confirmed by an experiment that a barrier height φb is about 1.05 eV when the thermal history at 350° C. due to curing is not even applied to the Ti film.

In addition, it has been confirmed by an experiment that in order to sufficiently stabilize the barrier height φb, it is preferable to sinter Ti at 400° C. or more, more preferably at 450° C. FIG. 13 shows a result of the experiment. In FIG. 13, a horizontal axis shows a temperature of the Ti sintering, and a vertical axis shows a value of the barrier height φb, in which the Ti sintering is performed at 400° C., 450° C., 500° C., and 550° C., and a minimum value, a maximum value, and an average value of the barrier height φb at each temperature are shown.

As shown in FIG. 13, when the temperature of the Ti sintering is 450° C., the barrier height φb is the maximum, and a fluctuation width (a difference between the maximum value and the minimum value) is the smallest. However, when the sintering temperature exceeds 450° C., it is considered that the Schottky junction starts partially braking down, and it is changed to the ohmic junction, so that the barrier height φb is lowered, and the variation in barrier height φb becomes large.

In addition, as for the timing of the Ti sintering, it is preferably performed just after the patterning of the Schottky electrode 4, before a surface electrode pad (which will be described later) is formed on the Schottky electrode 4. This is because a metal other than a Schottky metal, such as Al to constitute the surface electrode pad does not come close to, not mix in, or not come in contact with the vicinity of the interface between the Schottky metal and SiC, and a preferable junction as designed can be formed.

In addition, when the Ti sintering is performed before the patterning of the Schottky electrode 4, a transition layer such as a Ti silicide layer is formed in the interface between Ti and SiC due to the Ti sintering, and it could become problematic when the Ti film is patterned by wet etching.

Figure 10:
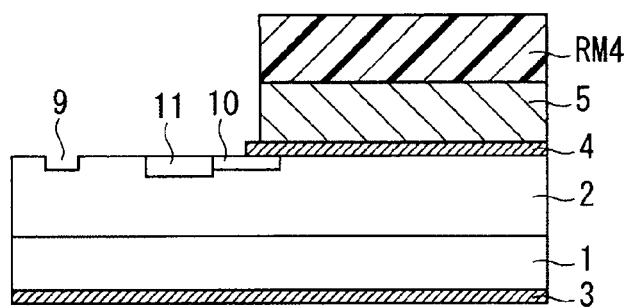

After the sintering of the Schottky electrode 4 has been completed, in a step shown in FIG. 10, an Al film having a thickness of about 3 to 5 μm is formed on the Schottky electrode 4, the GR region 10, the JTE region 11, and the epitaxial layer 2, by vapor deposition or sputtering. Then, a resist mask RM4 is formed on an upper part of the Al film corresponding to the upper part of the Schottky electrode 4 by photolithography, and wet etching is performed through the resist opening with a thermal phosphoric acid to pattern the Al film, thereby a surface electrode pad 5 is provided.

In addition, as another example, a Ti film serving as the Schottky electrode 4 is formed, a buffer layer is formed of Pt (platinum) thereon, an Al film having a thickness of 3 to 5 μm is formed, the surface electrode pad 5 and the Schottky electrode 4 are formed by patterning the Al film and the Ti film, and then Ti sintering is performed. In addition, as for a metal in which wet etching with Pt is not easily performed, dry etching may be used therefor.

By forming the Pt buffer layer, Al is prevented from coming close to, mixing in, and coming in contact with the vicinity of the interface between the Schottky metal and SiC due to the sintering, so that the preferable Schottky junction as designed can be formed, and the adhesiveness of the interface between Al and Ti can be enhanced.

Figure 11:
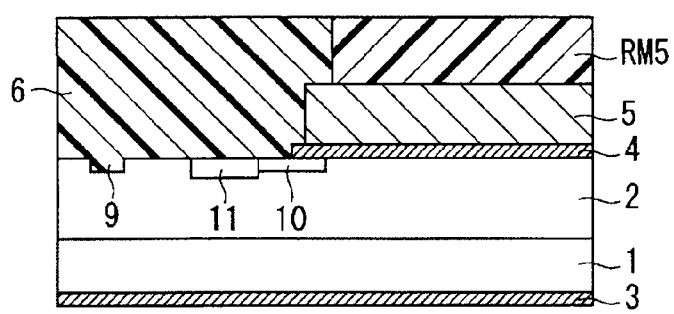

Then, in a step shown in FIG. 11, a resist mask RM5 is formed on the surface electrode pad 5 by photolithography, a polyimide resin is applied to a resist opening, and a curing treatment is performed for 60 minutes in a nitrogen atmosphere. Here, by setting a curing temperature to a temperature such as 350° C. which is lower than the sintering temperature after the Schottky junction has been formed, by 50° C. or more, the state of the Schottky junction interface can be kept stable due to the Ti sintering.

Figure 12:
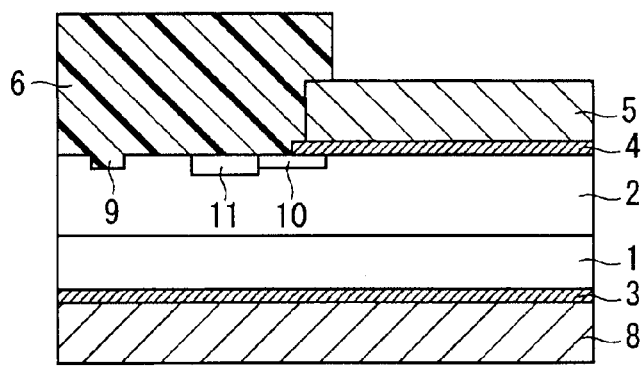

After the polyimide resin has been cured, as shown in FIG. 12, a Ni film and an Au film are sequentially formed in this order on the ohmic electrode 3 by DC sputtering, thereby a back surface electrode pad 8 is provided. Each thickness of the Ni film and the Au film is several hundred nm, for example.

Moreover, since the ohmic electrode 3 as a base is a nickel silicide, it is preferable that a film forming device can execute DC sputtering and radio-frequency (RF) sputtering because the surface of the nickel silicide can be damaged by the RF sputtering just before the Ni film is formed to enhance the adhesiveness with the nickel silicide.

By forming the back surface electrode pad 8 on the ohmic electrode 3, preferable solder wettability can be provided when the back surface of the semiconductor chip is die-bonded.

In addition, since the back surface electrode pad 8 is formed after the polyimide resin has been cured, the Ni film is prevented from diffusing onto the surface of the Au film at the curing step, and a Ni oxide is prevented from being formed on the surface of the back surface electrode pad 8, so that the solder wettability does not deteriorate.

<Second Preferred Embodiment>

According to the manufacturing method of the SiC—SBD in the first preferred embodiment of the present invention, a silicon oxide film is not formed on the surface of the epitaxial layer 2 in forming the GR region 10 and the JTE region 11 by the ion implantation as described above with reference to FIGS. 5 and 6.

However, in order to optimize an impurity concentration profile of an ion implantation region according to a device specification, a silicon oxide film may be formed before the ion implantation, and the silicon oxide film may be used as an implantation through film.

Hereinafter, a description will be made of a method for forming the GR region 10 and the JTE region 11 through an implantation through film as a manufacturing method of a SiC—SBD according to a second preferred embodiment, with reference to FIGS. 14 to 16. In addition, as for the same configuration as that of the first preferred embodiment described with reference to FIGS. 4 to 12, the same reference is allotted to it and a duplicated description is not given.

Figure 14:
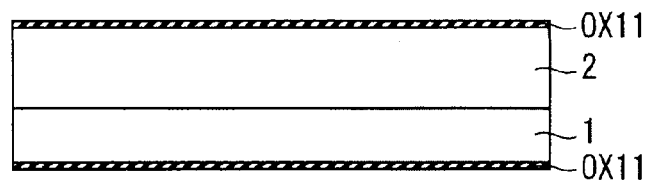
FIGS. 14 to 16 are cross-sectional views showing steps of producing a SiC—SBD of a second preferred embodiment according to the present invention.

First, in a step shown in FIG. 14, a silicon oxide film OX11 having a thickness of about 100 nm is formed on the epitaxial layer 2 by dry thermal oxidation. In addition, the silicon oxide film OX11 is also formed on the back surface of the SiC substrate 1.

Then, through the step described with reference to FIG. 4, the surface of the epitaxial layer 2 is etched by about 0.3 μm, thereby the alignment mark 9 is formed. In this case, the silicon oxide film OX11 is etched through the opening of the resist mask, and then the surface of the epitaxial layer 2 is etched through the opening of the silicon oxide film OX11.

Figure 15:
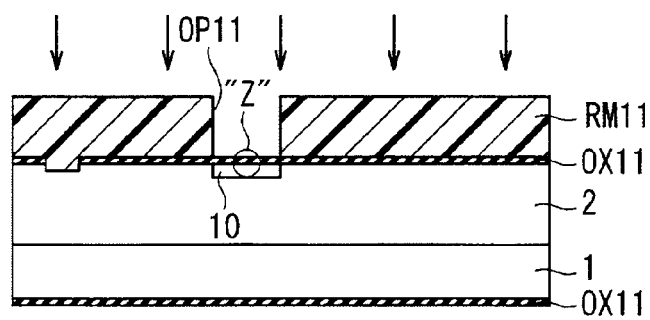

Then, in a step shown in FIG. 15, a resist mask RM11 is formed on the silicon oxide film OX11, and an opening OP11 to form the GR region 10 is patterned by photolithography. Then, ions of Al as a p-type impurity are implanted from an upper part of the resist mask RM11, thereby the RG region 10 is formed in an upper layer part of the epitaxial 2 through the opening OP11. An implantation condition at this time is set such that a peak concentration becomes about $5 \times 10^{17}/cm^3$ at energy of 350 keV.

Figure 16:
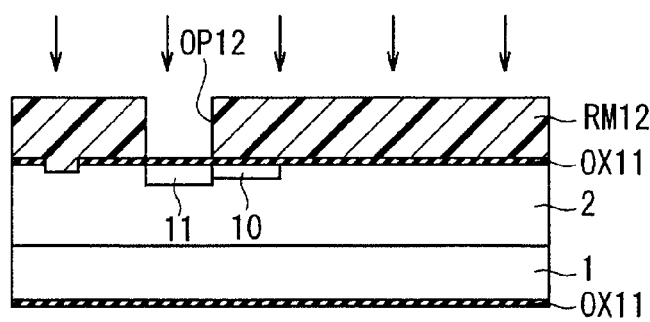

Then, after the resist mask RM11 has been removed, in a step shown in FIG. 16, a resist mask RM12 is formed on the silicon oxide film OX11, and an opening OP12 to form the JTE region 11 is patterned by photolithography. Then, for example, ions of Al as a p-type impurity are implanted from an upper part of the rest mask RM12, and the JTE region 11 is formed on an upper layer part of the epitaxial layer 2 through the opening OP12. An implantation condition at this time is such that a peak concentration becomes about $2 \times 10^{17}/cm^3$ at energy of 500 keV.

Then, after the resist mask RM12 has been removed, and the silicon oxide film OX11 has been also removed, the impurity is subjected to an activation annealing treatment to complete the GR region 10 and the JTE region 11 as the termination structure, and the steps after the activation annealing are the same as those in the first preferred embodiment.

Thus, as the GR region 10 and the JTE region 11 are formed through the implantation through film, an impurity concentration can increase in the vicinity of each surface of the GR region 10 and the JTE region 11.

Figure 17:
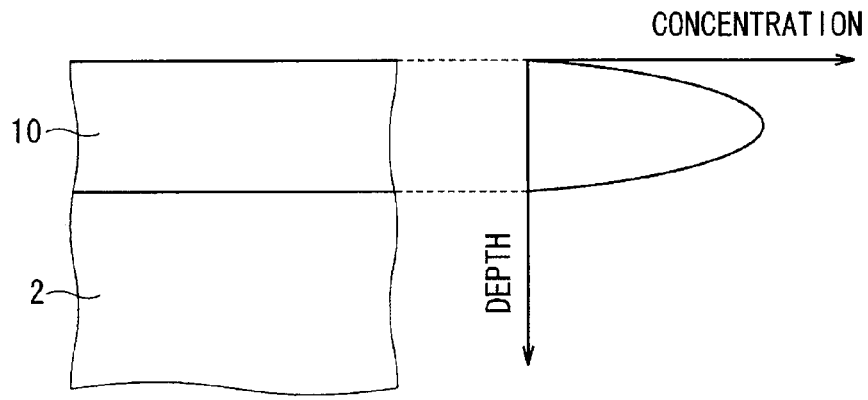
FIG. 17 is a view schematically showing a concentration profile of an implanted impurity when a GR region is formed without providing an implantation through film.

This effect will be described with reference to FIGS. 17 and 18. FIG. 17 is a view schematically showing a concentration profile of the implanted impurity when the GR region 10 is formed without providing the implantation through film, and shows a part corresponding to a region Y in the GR region 10 in FIG. 5. In addition, FIG. 18 is a view schematically showing a concentration profile of the implanted impurity when the GR region 10 is formed through the implantation through film as described in the second preferred embodiment, and shows a part corresponding to a region Z in the GR region 10 in FIG. 15.

As shown in FIG. 17, when the impurity region is formed, the implantation condition is set such that the concentration peak can be provided in a center of the region in a depth direction, so that the impurity concentration is relatively low in a shallow part of the GR region 10, that is, in the vicinity of the surface.

Figure 18:
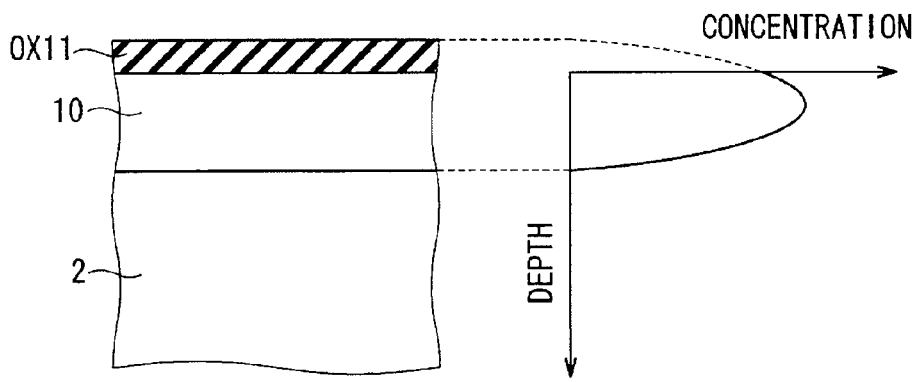
FIG. 18 is a view schematically showing a concentration profile of an implanted impurity when the GR region is formed through the implantation through film.

Meanwhile, as shown in FIG. 18, in the case where the GR region 10 is formed through the implantation through film (silicon oxide film OX11), when the implantation is performed at the same implantation energy as that in FIG. 17, the concentration profile of the impurity is shifted to the shallow part by the thickness of the silicon oxide film OX11. Therefore, the impurity concentration is relatively high in the shallow part of the GR region 10, that is, in the vicinity of the surface, after the silicon oxide film OX11 has been removed, the impurity concentration can be high in the vicinity of the surface of the GR region 10.

With this method, by changing the thickness of the implantation through film, the impurity concentration can be adjusted in the vicinity of the surface of the GR region 10.

<Third Preferred Embodiment>

Figure 19:
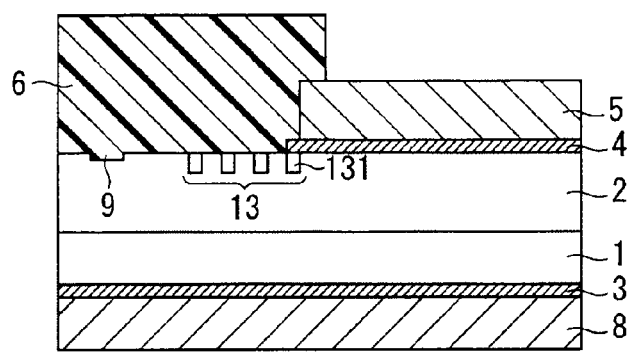
FIG. 19 is a cross-sectional view of a SiC—SBD having a FLR region.

The description has been made of the case where the GR region 10 and the JTE region 11 are formed as the termination structure in the manufacturing method of the SiC—SBD in the first preferred embodiment, the termination structure is not limited to the above, and the termination structure can be formed by a FLR (Field Limiting Ring) region 13 shown in FIG. 19.

The FLR region 13 shown in FIG. 19 is formed such that a plurality of ring-shaped p-type impurity regions 131 are provided around the electrode region 17.

Figure 20:
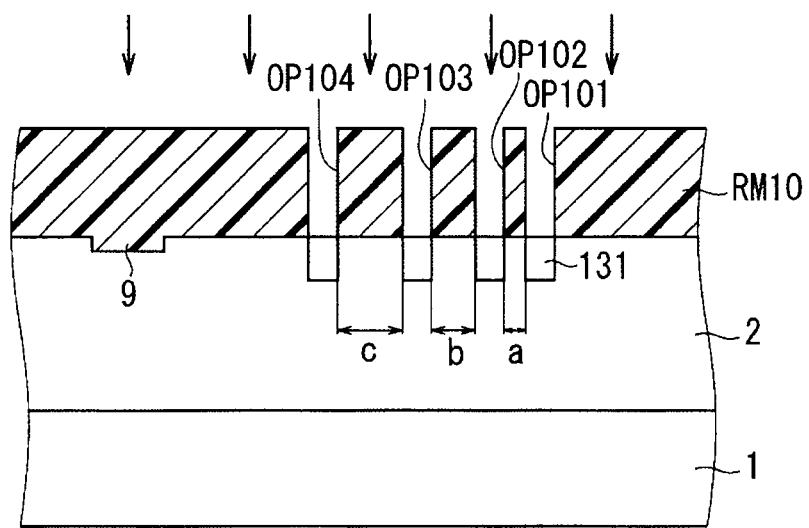
FIG. 20 is a cross-sectional view showing a step of producing the FLR region.
Figure 21:
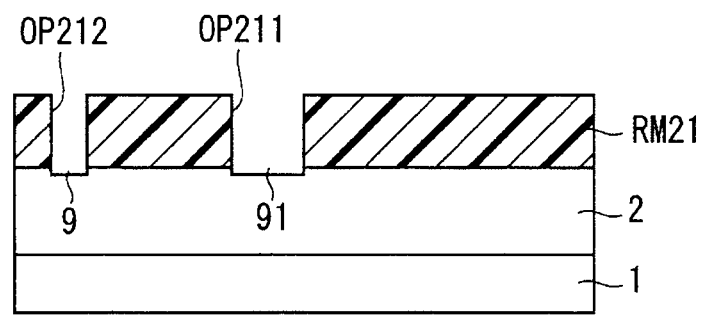
FIGS. 21 to 24 are cross-sectional views showing steps of producing a SiC—SBD of a third preferred embodiment according to the present invention.
Figure 22:
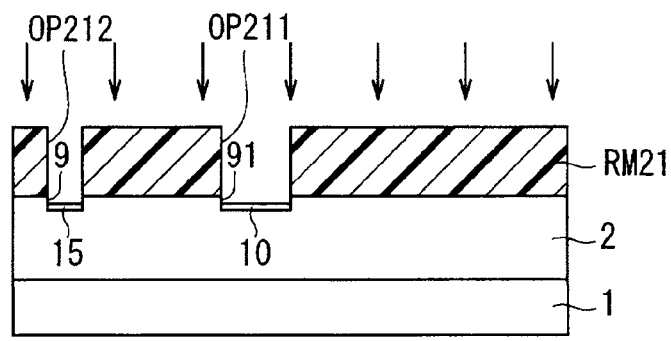

FIG. 20 is a cross-sectional view showing a production step of the FLR region 13, and the step corresponds to the steps of forming the GR region 10 and the JTE region 11 described with reference to FIGS. 5 and 6 in the first preferred embodiment.

Through the step described with reference to FIG. 4, a resist mask RM10 is formed on the epitaxial layer 2 in which the alignment mark 9 has been formed, and openings OP101, OP102, OP103, and OP104 to form the FLR region 13 are formed by photolithography. Then, ions of Al as a p-type impurity are implanted from an upper part of the resist mask RM10, and the plurality of p-type impurity region 131 are formed in an upper layer part of the epitaxial layer 2 through the opening OP2. An implantation condition at this time is such that a peak concentration becomes $3 \times 10^{17}/\text{cm}^3$ at energy of 350 keV.

Here, when it is assumed that a distance between the openings OP101 and OP102 is "a", a distance between the openings OP102 and 103 is "b", and a distance between the openings OP103 and OP104 is "c", the patterning is performed so as to satisfy c>b>a.

Thus, arrangement distances of the ring-shaped p-type impurity regions 131 increase toward the outside, and this means that an impurity concentration of the FLR region 13 becomes low toward the outside.

As a result, the FLR region 13 has the same function as that of the GR region 10 and the JTE region 11, but it has the advantage that the photolithography is only needed one time to form the FLR region 13, while the photolithography is needed two times to form the GR region 10 and the JTE region 11.

In addition, when the distance "a" is 4 μm, the distance "b" is 6 μm, the distance "c" is 8 μm, and a width of the p-type impurity region 131 is 3 μm, a whole width of the FLR region 13 is 30 μm, and it has the advantage that the length is shorter than the GR region 10 and the JTE region 11.

<Fourth Preferred Embodiment>

To reduce the number of photolithography processes has the advantage that a production cost of the semiconductor device can be reduced, and in this point, the number of photolithography processes can be reduced in a manufacturing method of a SiC—SBD according to a third preferred embodiment which will be described with reference to FIGS. 21 to 24.

That is, according to the first preferred embodiment, as described with reference to FIGS. 4 and 5, the photolithography is needed three times to form the alignment mark 9, and form the GR region 10 and the JTE region 11.

However, according to the production method in the third preferred embodiment to be described below with reference to FIGS. 21 to 24, the photolithography is only needed two times.

That is, a resist mask RM21 is formed on the epitaxial layer 2 before the alignment mark 9 is formed, and an opening OP212 to form the alignment mark 9, and an opening OP211 to form a GR region 10 are patterned by photolithography. Then, the surface of the epitaxial layer 2 is etched by 0.3 μm through each of the openings OP212 and the opening OP211, thereby the alignment mark 9 and a GR recessed part 91 are formed. Then, in a step shown in FIG. 22, ions Al as a p-type impurity are implanted from an upper part of the resist mask RM21, and a p-type impurity region 15 and the GR region 10 are formed under bottom surfaces of the alignment mark 9 and the GR recessed part 91 through the opening OP212 and the opening OP211, respectively. An implantation condition at this time is set such that a peak concentration becomes about $5 \times 10^{17}/\text{cm}^3$ at energy of 350 keV.

Figure 23:
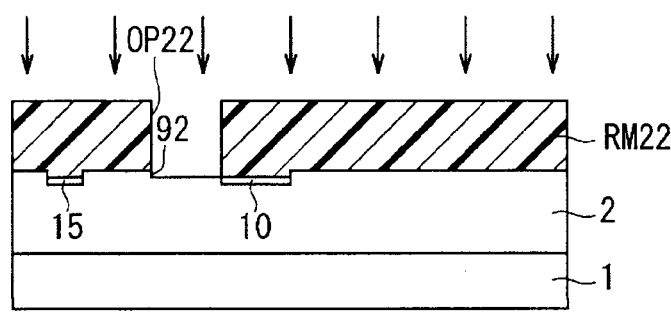

Then, after the resist mask RM21 has been removed, in a step shown in FIG. 23, the resist mask RM22 is formed on the epitaxial layer 2, and an opening OP22 to form the JTE region 11 is patterned by photolithography. Thus, the surface of the epitaxial layer 2 is etched by 0.3 μm through the opening OP22, thereby a JTE recessed part 92 is formed.

Figure 24:
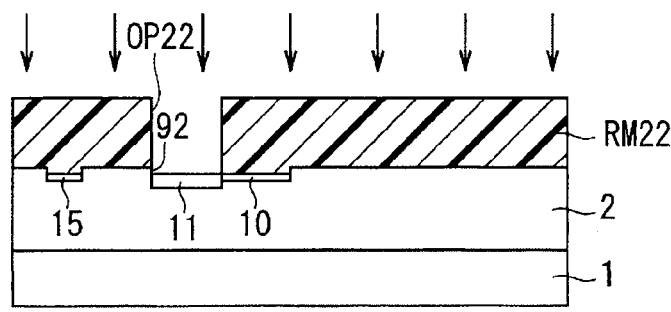

Then, in a step shown in FIG. 24, for example, ions of Al as a p-type impurity are implanted from an upper part of the resist mask RM22, thereby the JTE region 11 is formed under a bottom surface of the JTE recessed part 92 through the opening OP22. An implantation condition at this time is set such that a peak concentration becomes about $2 \times 10^{17}/\text{cm}^3$ at energy of 500 keV. Thus, a configuration in which the impurity region is provided under the bottom surface of the recessed part is called a recessed structure.

The recessed structure may be employed in the FLR region 13 described in the third preferred embodiment. In this case, the resist mask used in etching the alignment mark 9 can be also used as the resist mask used in forming the FLR region 13, so that the photolithography is needed only one time to form the alignment mark 9 and the FLR region 13, which further reduces the production cost.

In addition, the recessed structure may be used in the case where only the GR region 10 is provided without providing the JTE region 11. In this case, the photolithography is needed only one time to form the alignment mark 9 and the GR region 10, which further reduces the production cost.

<Another example of Schottky metal>

The description has been made of the case where Ti is used as the Schottky metal in the above-described first to third preferred embodiments, but another Schottky metal such as Ni, W, Mo may be used. Since a work function and a pinning effect with SiC differ depending on the metal material, the forward barrier height φB obtained as the diode characteristics can be changed, so that the desired barrier height φB can be obtained by appropriately selecting the material.

While the invention has been shown and described in detail, the foregoing description is in all aspects illustrative and not restrictive. It is therefore understood that numerous modifications and variations can be devised without departing from the scope of the invention.

What is claimed is:

1. A manufacturing method of a silicon carbide semiconductor device, comprising the steps of:
   (a) preparing a first conductivity type silicon carbide substrate;
   (b) forming a first conductivity type epitaxial layer on one main surface of said silicon carbide substrate;
   (c) forming a termination structure by implanting ions of a second conductivity type impurity in an upper layer part of said epitaxial layer around a part for an electrode region;
   (d1) performing an annealing treatment to activate said implanted second conductivity type impurity;
   (d2) removing said epitaxial layer, by dry etching, from an uppermost surface to a depth of 100 to 150 nm after said annealing treatment;
   (d3) forming a silicon oxide film on said epitaxial layer by dry thermal oxidation;
   (e) forming a first metal film on another main surface of said silicon carbide substrate;
   (f) forming an ohmic junction between said first metal film and said other main surface of said silicon carbide substrate by performing a heat treatment on said silicon carbide substrate at a first temperature, after said step (e);
   (g) removing said silicon oxide film, after said step (f);
   (h) forming a second metal film on said epitaxial layer, after said step (g); and
   (i) forming a Schottky junction between said second metal film and said epitaxial layer by performing a heat treatment on said silicon carbide substrate at a second temperature, after said step (h).

2. The manufacturing method of the silicon carbide semiconductor device according to claim 1, wherein
said step (c) includes the step of forming a plurality of termination structures including the termination structure by implanting the ions of said second conductivity type impurity around the part for said electrode region.

3. The manufacturing method of the silicon carbide semiconductor device according to claim 2, wherein
said step (c) includes the steps of
(c1) forming a guard ring region by implanting the ions of said second conductivity type impurity at a first concentration; and
(c2) forming a JTE (Junction Termination Extension) region by implanting the ions of said second conductivity type impurity in such a manner that the region is continuously formed on the outside of said guard ring region at a second concentration lower than said first concentration.

4. The manufacturing method of the silicon carbide semiconductor device according to claim 2, wherein
said step (c) includes the step of:
(c1) implanting the ions of said second conductivity type impurity multiple times in such a manner that a plurality of second conductivity type impurity regions are formed at intervals in a plane of said epitaxial layer; and said step (c1) includes the step of forming the plurality of said second conductivity type impurity regions such that arrangement distances thereof increase toward the outside.

5. The manufacturing method of the silicon carbide semiconductor device according to claim 1, wherein
said step (h) includes the step of forming said second metal film with Ti, and
said step (i) includes the step of performing a heat treatment within a range of temperature of 450±50° C. as said second temperature.

6. The manufacturing method of the silicon carbide semiconductor device according to claim 1, wherein
said step (i) includes the step of performing the heat treatment within a range of temperature of 450±20° C. as said second temperature.

7. The manufacturing method of the silicon carbide semiconductor device according to claim 1, wherein
said step (d3) includes the step of forming said silicon oxide film into 15 to 40 nm thick.

8. The manufacturing method of the silicon carbide semiconductor device according to claim 1, further comprising the step of:
forming a third metal film on said second metal film after said step (i).

* * * * *